(12) United States Patent
Kim (10) Patent No.: US 8,698,145 B2
(45) Date of Patent: Apr. 15, 2014

(54) ORGANIC LIGHT-EMITTING DISPLAY DEVICE AND METHOD OF MANUFACTURING THE SAME

(75) Inventor: Sung-Ho Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/084,698

(22) Filed: Apr. 12, 2011

(65) Prior Publication Data
US 2012/0074412 A1   Mar. 29, 2012

(30) Foreign Application Priority Data
Sep. 29, 2010 (KR) .................... 10-2010-0094464

(51) Int. Cl.
*H01L 27/32* (2006.01)
(52) U.S. Cl.
USPC ............ 257/59; 257/40; 257/71; 257/86; 257/88; 257/94; 257/E33.01; 257/E33.64
(58) Field of Classification Search
USPC ............ 257/40, 59, 71, 86, 88, 94, E33.01, 257/E33.062, E33.064
See application file for complete search history.

(56) References Cited

U.S. PATENT DOCUMENTS

| | | | |
|---|---|---|---|
| 7,525,135 B2 * | 4/2009 | Iga | 257/250 |
| 2010/0193790 A1 | 8/2010 | Yeo et al. | |

FOREIGN PATENT DOCUMENTS

| | | |
|---|---|---|
| KR | 10-2004-0037889 | 5/2004 |
| KR | 10-2007-0068092 | 6/2007 |
| KR | 10-2009-0120698 | 11/2009 |
| KR | 10-0943187 | 2/2010 |
| KR | 10-2010-0088269 | 8/2010 |

* cited by examiner

*Primary Examiner* — Tran Tran
(74) *Attorney, Agent, or Firm* — Robert E. Bushnell, Esq.

(57) ABSTRACT

In an organic light-emitting display device and a method of manufacturing the same, the organic light-emitting display device comprises: an active layer of a thin film transistor which includes a semiconductor material, and which is formed on a substrate; a lower electrode of a capacitor which includes a semiconductor material doped with ion impurities, and which is formed on the substrate; a first insulating layer formed on the substrate so as to cover the active layer and the lower electrode; a first gate electrode which is a transparent conductive material, and which is formed on the first insulating layer; a second gate electrode which is a metal, and which is formed on the first gate electrode; an upper electrode of a capacitor which is formed on the first insulating layer and includes a transparent conductive material; source and drain electrodes of a thin film transistor which are electrically connected to the active layer; a pixel electrode formed on the first insulating layer, which is a semi-permeable metal electrically connected to one of the source and drain electrodes; an intermediate layer formed on the pixel electrode and including an organic emission layer; and an opposite electrode facing the pixel electrode with the intermediate layer therebetween.

15 Claims, 12 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Sep. 29, 2010 and there duly assigned Serial No. 10-2010-0094464.

BACKGROUND OF THE INVENTION

1. Field of the Invention

The present invention relates to an organic light-emitting display device and a method of manufacturing the same.

2. Description of the Related Art

Organic light-emitting display devices have been considered as next generation displays due to their advantages such as light weight, thin thickness, wide viewing angle, fast response speeds, and low power consumption.

On the other hand, organic light-emitting display devices for realizing full-color images adopt an optical resonance structure for changing the optical lengths of wavelengths which are emitted from organic emission layers in pixels of different colors (for example, red, green, and blue pixels).

SUMMARY OF THE INVENTION

The present invention provides an organic light-emitting display device which can be fabricated simply, and which has excellent display characteristics, and a method of manufacturing the organic light-emitting display device.

According to an aspect of the present invention, an organic light-emitting display device comprises: an active layer of a thin film transistor which includes a semiconductor material, wherein the active layer is formed on a substrate; a lower electrode of a capacitor which includes a semiconductor material doped with ion impurities, wherein the lower electrode is formed on the substrate; a first insulating layer formed on the substrate so as to cover the active layer and the lower electrode; a first gate electrode which is a transparent conductive material, and which is formed on the first insulating layer; a second gate electrode which comprises a metal, and which is formed on the first gate electrode; an upper electrode of a capacitor, wherein the upper electrode is formed on the first insulating layer and comprises a transparent conductive material; source and drain electrodes of a thin film transistor, wherein the source and drain electrodes are electrically connected to the active layer; a pixel electrode formed on the first insulating layer, wherein the pixel electrode includes a semi-permeable metal electrically connected to one of the source and drain electrodes; an intermediate layer formed on the pixel electrode, and including an organic emission layer; and an opposite electrode facing the pixel electrode with the intermediate layer disposed therebetween.

The semi-permeable metal is a silver (Ag) alloy.

The Ag alloy comprises palladium (Pd) and copper (Cu).

The semi-permeable metal is formed to have a thickness of about 80 to about 200 Å.

The first gate electrode and the upper electrode of the capacitor comprise the same transparent conductive material, and the transparent conductive material comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second gate electrode has an etch rate different from that of the pixel electrode.

The second gate electrode comprises at least one material selected from the group consisting of aluminum (Al), platinum (Pt), Pd, Ag, magnesium (Mg), gold (Au), nickel (Ni), neodymium (Nd), iridium (Ir), chrome (Cr), lithium (Li), calcium (Ca), molybdenum (Mo), titanium (Ti), tungsten (W), and Cu.

The second gate electrode comprises a multi-layer structure.

The organic light-emitting display device may further include a second pixel electrode comprising a transparent conductive material so as to surround the entire pixel electrode, wherein the transparent conductive material is the same as that of the first gate electrode.

The organic light-emitting display device may further include a third pixel electrode comprising a metal which covers ends of the second pixel electrode, wherein the metal is the same as that of the second gate electrode.

Outer etched surfaces of the second pixel electrode and the third pixel electrode have the same shape.

The third pixel electrode, the second gate electrode, and the source and drain electrodes are formed of the same metal.

The pixel electrode is a semi-permeable mirror partially receiving and reflecting light emitted from the organic emission layer.

The opposite electrode is a reflective electrode reflecting light emitted from the organic emission layer.

Outer etched surfaces of the first gate electrode and the second gate electrode have the same shape.

According to another aspect of the present invention, a method of manufacturing an organic light-emitting display device comprises: a first mask process for forming a semiconductor layer on a substrate, and forming an active layer of a thin film transistor and a lower electrode of a capacitor by patterning the semiconductor layer; a second mask process for forming a first insulating layer and a semi-permeable metal on the substrate so as to cover the active layer and the lower electrode, and for forming a pixel electrode by patterning the semi-permeable metal; a third mask process for sequentially forming a transparent conductive layer and a first metal layer on the substrate so as to cover the pixel electrode, and for forming first and second gate electrodes of a thin film transistor and first and second upper electrodes of a capacitor by patterning the transparent conductive layer and the metal layer; a fourth mask process for forming a second insulating layer so as to cover the pixel electrode, the first and second gate electrodes, and the first and second upper electrodes, and for forming openings exposing the pixel electrode, source and drain regions of the active layer, and the second upper electrode by patterning the second insulating layer; a fifth mask process for forming a second metal layer so as to cover the pixel electrode and the openings, and for forming source and drain electrodes by patterning the second metal layer; and a sixth mask process for forming a third insulating layer so as to cover the source and drain electrodes, and for exposing the pixel electrode by patterning the third insulating layer.

After performing the third mask process, the source and drain regions of the active layer are doped with ion impurities by using the second gate electrode as a mask.

After performing the fifth mask process, the first upper electrode is exposed, and the lower electrode on the exposed first upper electrode is doped with ion impurities.

The semi-permeable metal comprises an Ag alloy.

The Ag alloy is formed so as to comprise Pd and Cu.

The semi-permeable metal is formed so as to have a thickness of about 80 to about 200 Å.

In the third mask process, the transparent conductive layer and the first metal layer are patterned so as to sequentially cover the pixel electrode.

The fourth mask process further comprises forming an opening exposing the first metal layer, which covers the pixel electrode, by patterning the second insulating layer.

the fifth mask process further comprises removing first and second metal layers covering the pixel electrode.

The first and second metal layers comprise the same material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, embodiments of the present invention will be described with reference to accompanying drawings as follows.

The organic light-emitting display device and a method of manufacturing the organic light-emitting display device will now be described with reference to FIGS. 1 thru 19.

Figure 18:
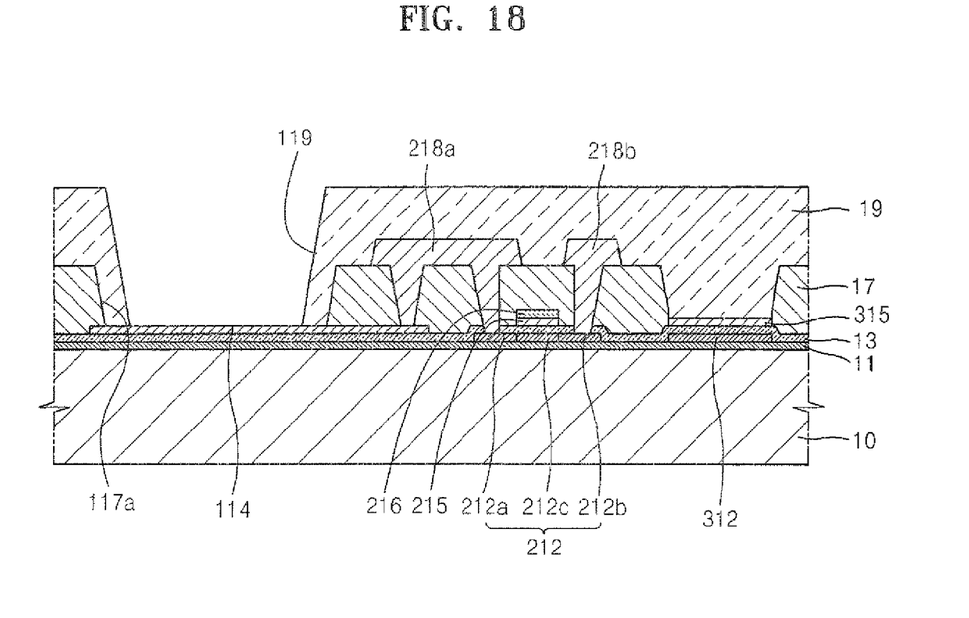
Figure 19:
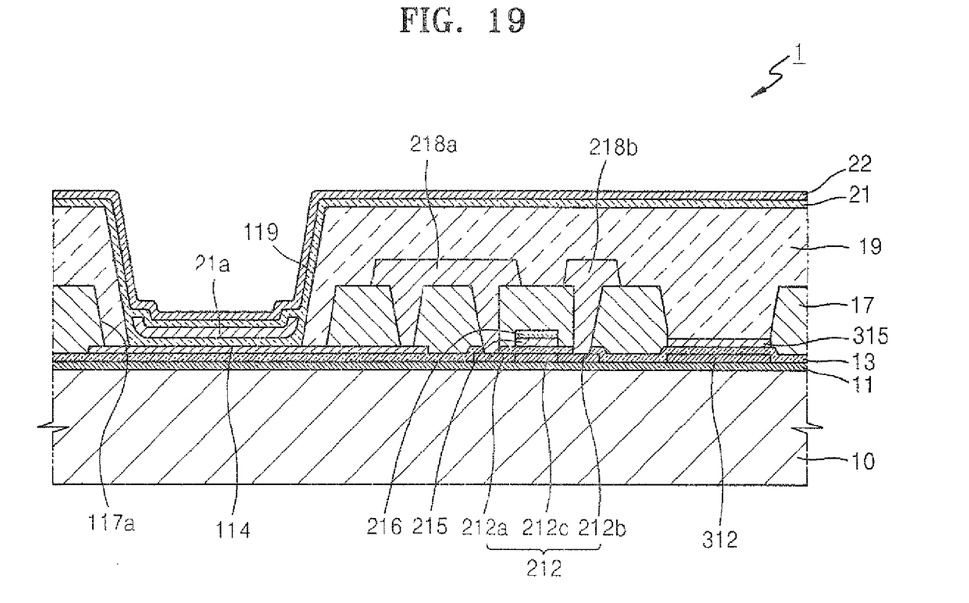
FIG. 19 is a schematic cross-sectional view illustrating the organic light-emitting display device manufactured through the method illustrated in FIGS. 1 thru 18.

FIGS. 1 thru 18 are schematic cross-sectional views illustrating a method of manufacturing the organic light-emitting display device according to a first embodiment of the present invention, and FIG. 19 is a schematic cross-sectional view illustrating the organic light-emitting display device manufactured through the method illustrated in FIGS. 1 thru 18.

Figure 1:
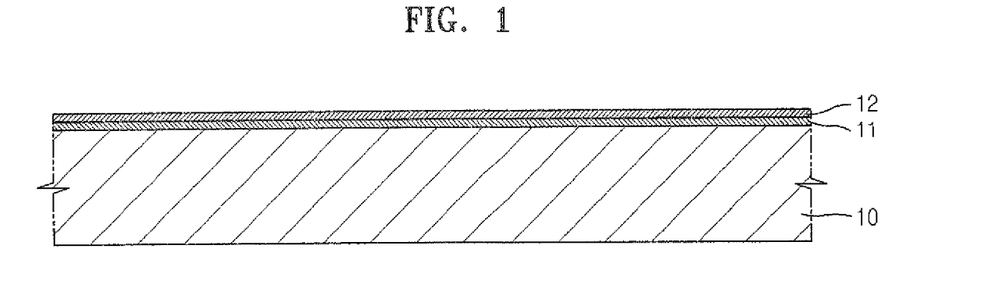
FIGS. 1 thru 18 are schematic cross-sectional views illustrating a method of manufacturing an organic light-emitting display device according to a first embodiment of the present invention.

Referring to FIG. 1, a buffer layer 11 and a semiconductor layer 12 are sequentially formed on a substrate 10.

The substrate 10 may be formed of a transparent glass material mainly including $SiO_2$. The buffer layer 11, including $SiO_2$ and/or $SiN_x$, may be further formed on the substrate 10 in order to maintain smoothness of the substrate 10 and to prevent impurities from infiltrating into the substrate 10.

The buffer layer 11 and semiconductor layer 12 may be formed by a deposition method, for example, a plasma enhanced chemical vapor deposition (PECVD) method, an atmospheric pressure CVD (APCVD) method, or a low pressure CVD (LPCVD) method.

The semiconductor layer 12 is formed on the buffer layer 11. The semiconductor layer 12 may be formed of amorphous silicon or polycrystalline silicon. The polycrystalline silicon may be obtained by crystallizing the amorphous silicon. The amorphous silicon may be crystallized by using a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method.

Figure 2:
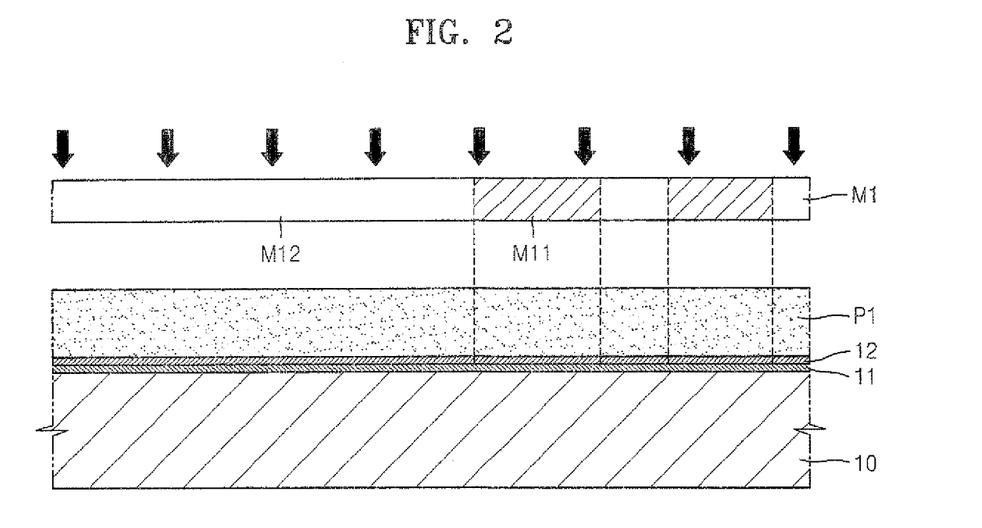

Referring to FIG. 2, a first photoresist P1 is applied on the semiconductor layer 12, and then a first mask process using a first photomask M1, which includes light-shielding portions M11 and light-transmitting portions M12, is performed.

Although not shown in FIG. 2, the stack structure is exposed via the first photomask M1 by using an exposure device (not shown), and then a series of processes, such as developing, etching, and stripping or ashing processes, are performed.

Figure 3:
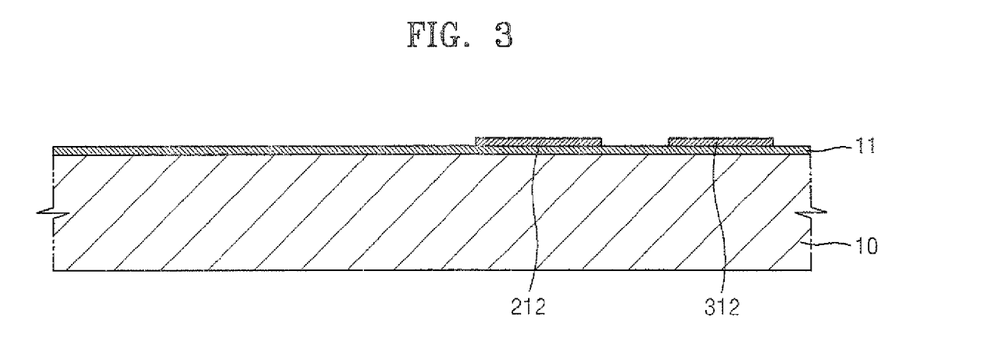

Referring to FIG. 3, the semiconductor layer 12 of FIG. 2 is patterned into an active layer 212 of a thin film transistor and a first electrode 312 of a capacitor, which is formed of the same material as the active layer 212 and on the same layer as the active layer 212, as a result of the first photomask process.

Figure 4:
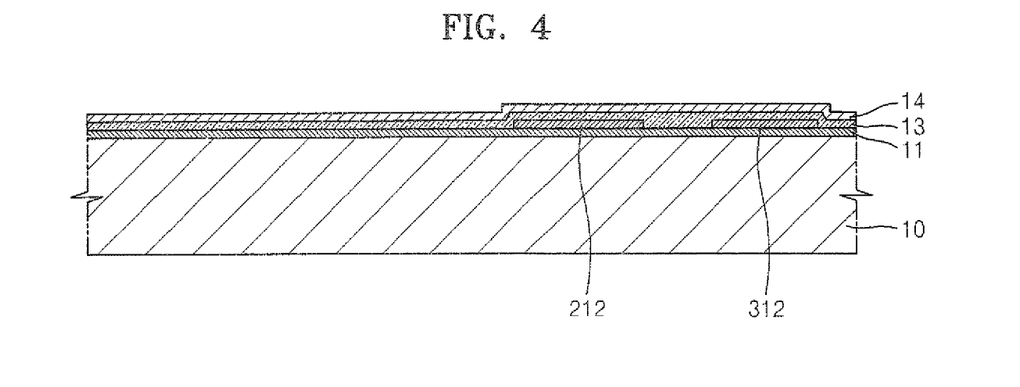

Referring to FIG. 4, a first insulating layer 13 and a semi-permeable metal layer 14 are sequentially stacked in the stated order on the structure shown in FIG. 3.

The first insulating layer 13 may have a single-layered structure or a multi-layered structure including $SiO_2$ or $SiN_x$, and functions as a gate insulating layer of the thin film transistor and a dielectric layer of the capacitor.

The semi-permeable metal layer 14 may include a silver (Ag) alloy. The semi-permeable metal layer 14 may further include palladium (Pd) and copper (Cu) mainly including Ag. The semi-permeable metal layer 14 functions as a semi-permeable mirror of a pixel electrode of the organic light-emitting display device having an optical resonant structure.

The semi-permeable metal layer 14 is formed so as to have a thickness of about 50 to 200 Å. If the thickness of the semi-permeable metal layer 14 is less than 50 Å, the reflective ability of the semi-permeable metal layer 14 is decreased, and thus it is difficult to obtain optical resonance between the semi-permeable metal layer 14 and an opposite electrode as described below. On the other hand, if the thickness of the semi-permeable metal layer 14 is greater than 200 Å, transmittance of the semi-permeable metal layer 14 is decreased, and thus light efficiency may be further decreased.

Figure 5:
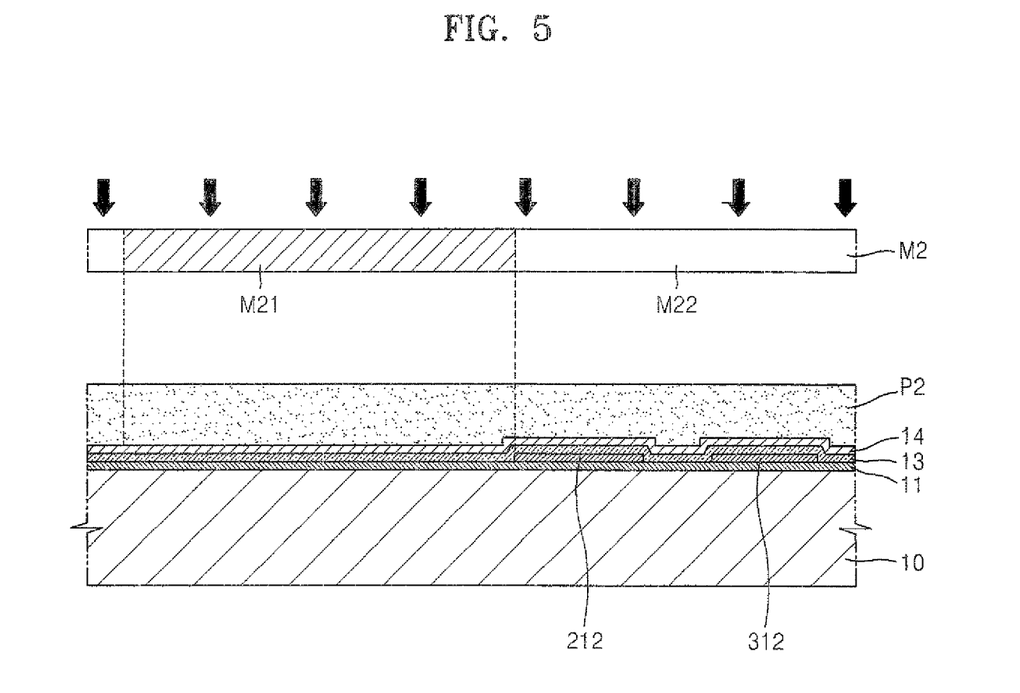

Referring to FIG. 5, a second photoresist P2 is applied on the semi-permeable metal layer 14, and a second mask process is performed using a second photomask M2, which includes light-shielding portions M21 and light-transmitting portions M22.

Figure 6:
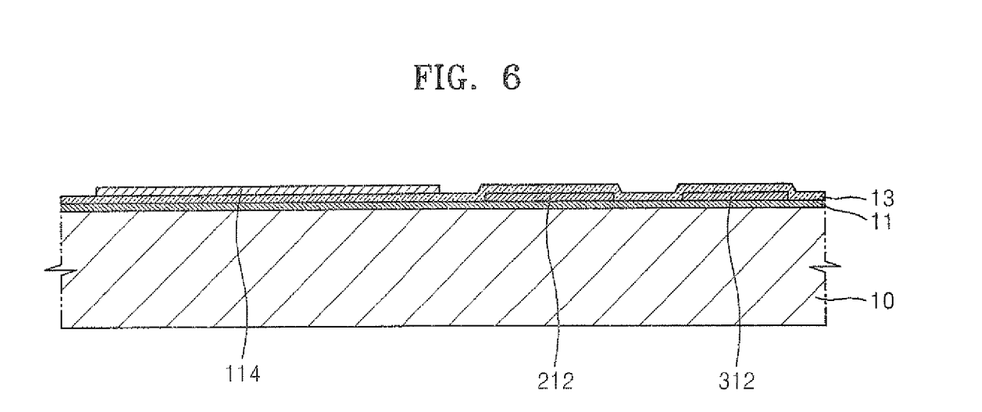

Referring to FIG. 6, as a result of the second mask process, the semi-permeable metal layer 14 of FIG. 5 is patterned into a pixel electrode 114.

As described above, optical efficiency of the organic light-emitting display device 1 of FIG. 19 having an optical resonant structure may further be increased by forming a semi-permeable mirror of an Ag alloy having an excellent semi-permeable property.

Figure 7:
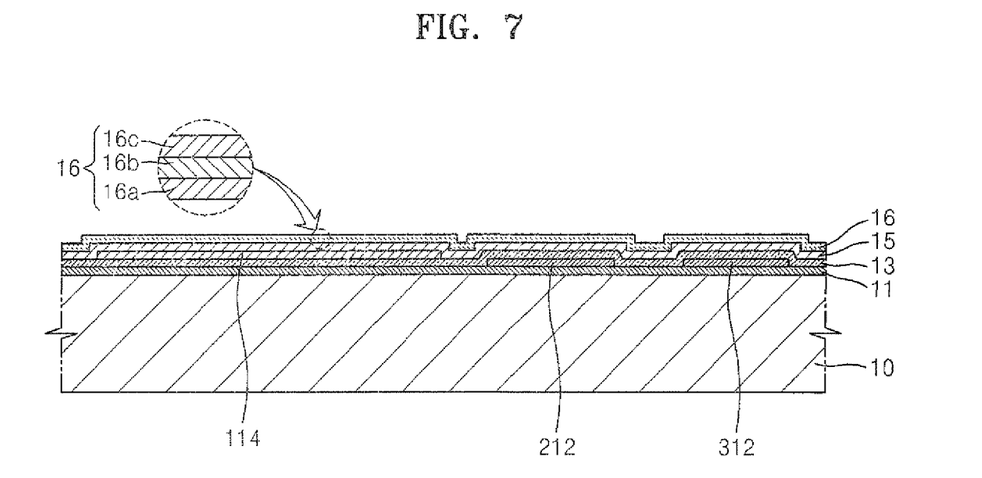

Referring to FIG. 7, a transparent conductive layer 15 and a first metal layer 16 are sequentially stacked on the structure shown in FIG. 6.

The transparent conductive layer 15 may be formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first metal layer 16 may be formed of a metal having an etch rate different from that of the pixel electrode 114. For example, the first metal layer 16 may include any one or more selected from the group consisting of aluminum (Al), platinum (Pt), Pd, Ag, magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). In the current embodiment, the first metal layer 16 includes Al.

Also, the first metal layer 16 may include a plurality of metal layers 16a, 16b, and 16c, and in the current embodiment, the first metal layer 16 includes a three-layer structure (Mo/Al/Mo). That is, the metal layer 16b is formed of Al and the upper and lower metal layers 16a and 16c are each formed of Mo. However, the present invention is not limited to the above example, and the first metal layer 15 may include various materials and various layers.

Figure 8:
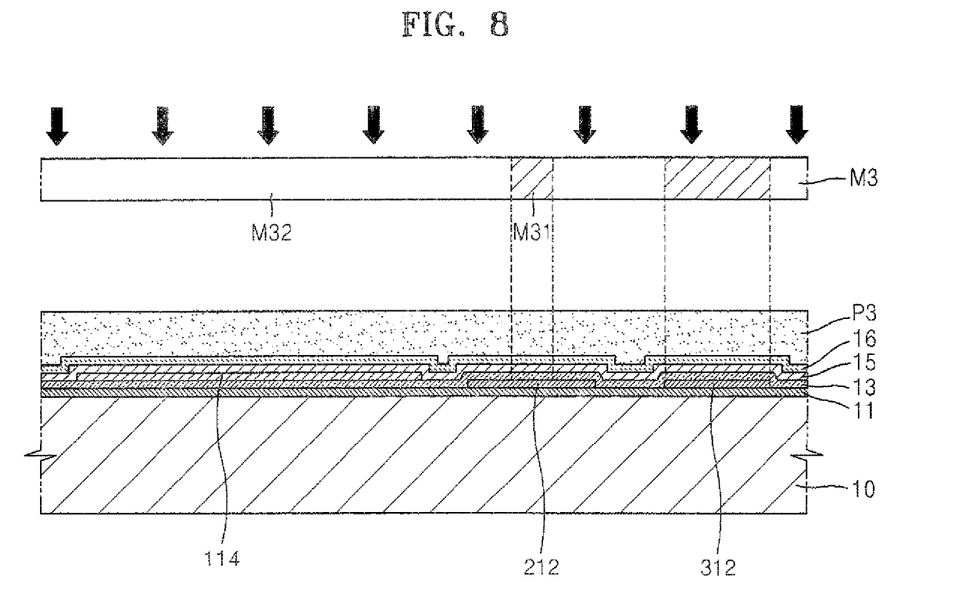

Referring to FIG. 8, a third photoresist P3 is applied on the first metal layer 16, and a third mask process is performed using a third photomask M3, which includes light-shielding portions M31 and light-transmitting portions M32.

Figure 9:
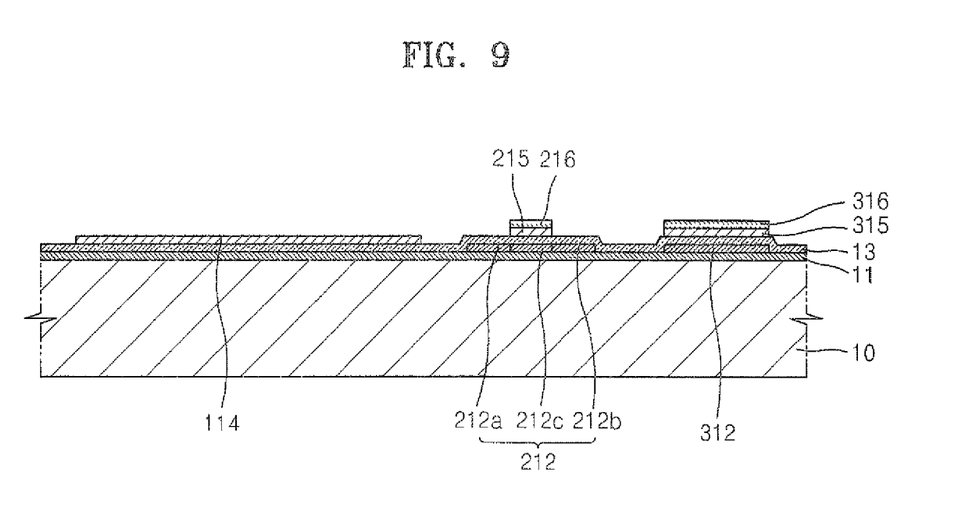

Referring to FIG. 9, as a result of the third photomask process, the transparent conductive layer 15 and the first metal layer 16 are respectively patterned into first and second gate electrodes 215 and 216, respectively, of the thin film transistor and first and second upper electrodes 315 and 316, respectively, of the capacitor.

The first and second gate electrodes 215 and 216, respectively, of the thin film transistor and the first and second upper electrodes 315 and 316, respectively, of the capacitor are etched in the same mask process, and thus their outer etched surfaces of respective ends are formed in the same shape.

Figure 10:
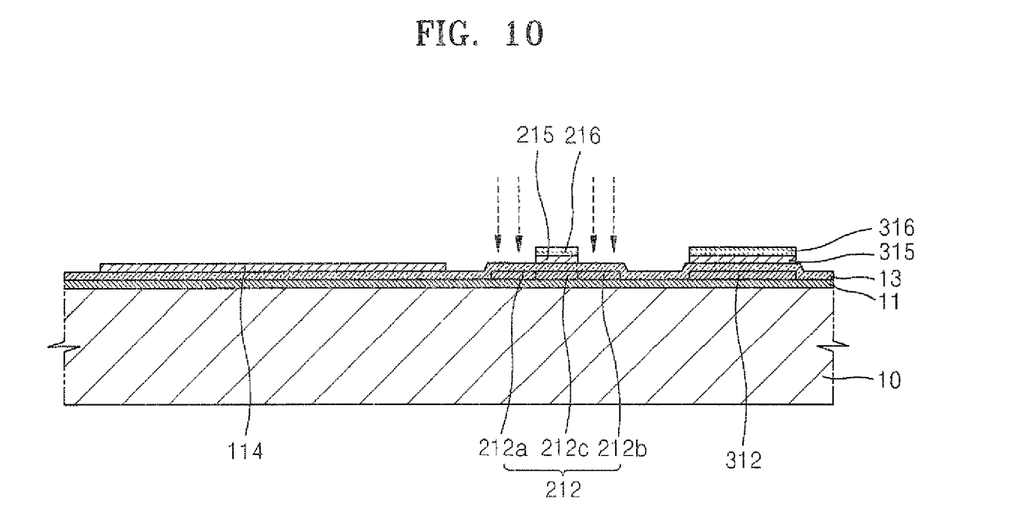

Referring to FIG. 10, the active layer 212 is doped with ion impurities by using the first and second gate electrodes 215 and 216, respectively, which are formed as a self-aligned mask as a result of the third mask process. Then, the active layer 212 includes source and drain regions 212a and 212b, respectively, doped with ion impurities and a channel region 212c between the source and drain regions 212a and 212b, respectively. That is, since the first and second gate electrodes 215 and 216, respectively, are used as the self-aligned mask, the source and drain regions 212a and 212b, respectively, may be formed without using an additional photomask.

As described above, since the pixel electrode 114 is used as the semi-permeable metal layer 14, which is a semi-permeable reflective layer, the structure of the pixel electrode 114 may be simplified. In addition, since the pixel electrode 114 is formed of an Ag alloy, light efficiency may be increased.

Furthermore, since the pixel electrode 114 is etched in a mask process separate from that of the first metal layer 16 and having a different etch rate for forming the second gate electrode 216, the pixel electrode 114 may be prevented from being damaged due to etching of the second gate electrode 216.

Figure 11:
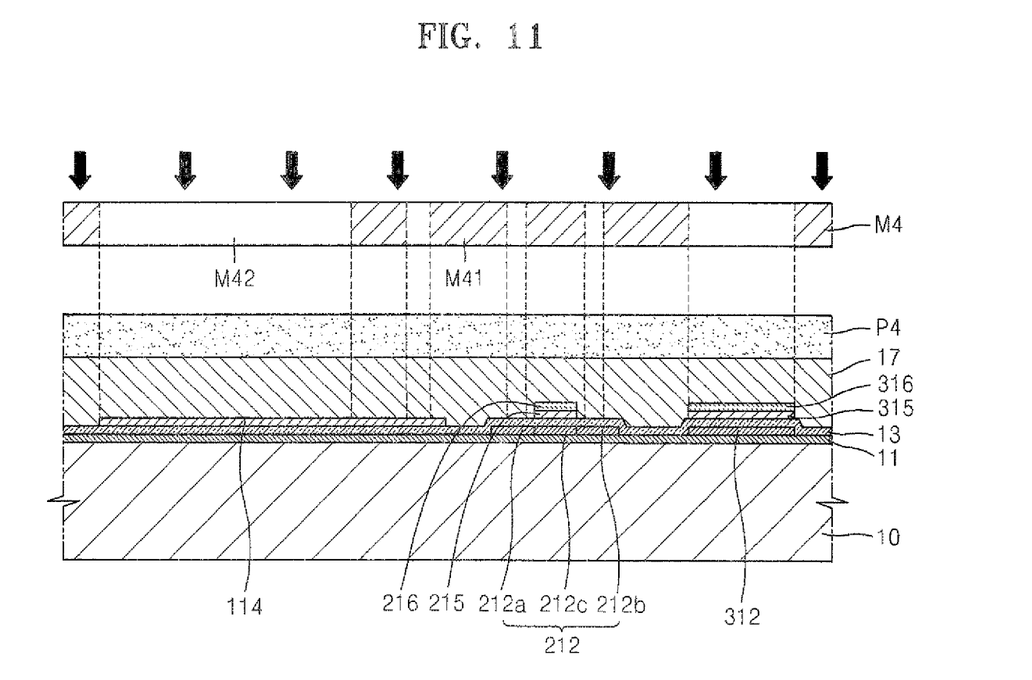

Referring to FIG. 11, a second insulating layer 17 and a fourth photoresist P4 are applied to the structure formed as a result of the third mask process, and then a fourth mask process is performed using a fourth photomask M4 including light-shielding portions M41 and light-transmitting portions M42.

Figure 12:
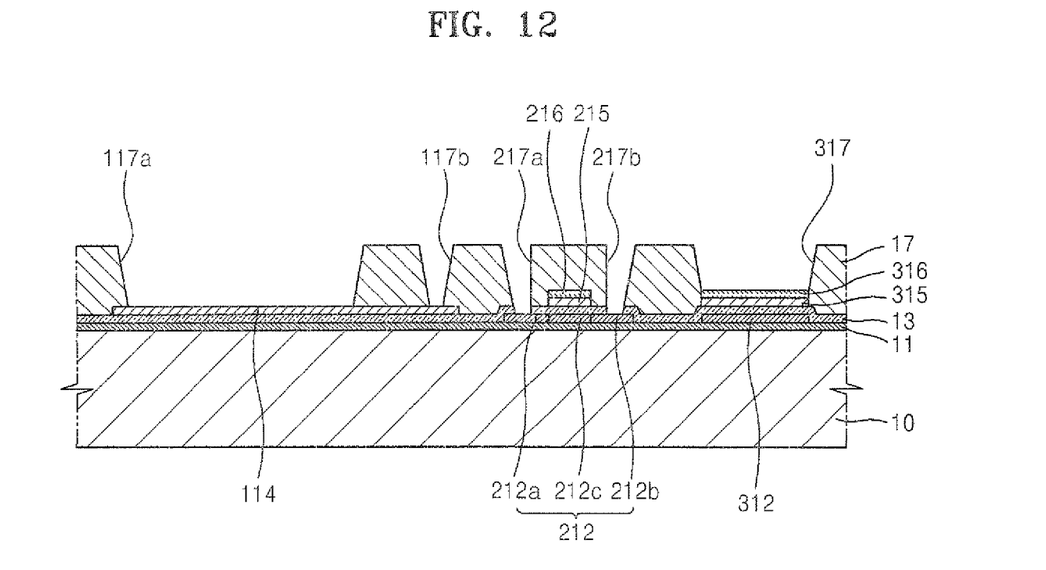

Referring to FIG. 12, as a result of the fourth mask process, first and second openings 117a and 117b, respectively, which expose the pixel electrode 114, contact holes 217a and 217b exposing the source and drain regions 212a and 212b, respectively, of the thin film transistor, and a third opening 317 exposing the second upper electrode 316 of the capacitor are formed in the second insulating layer 17.

Figure 13:
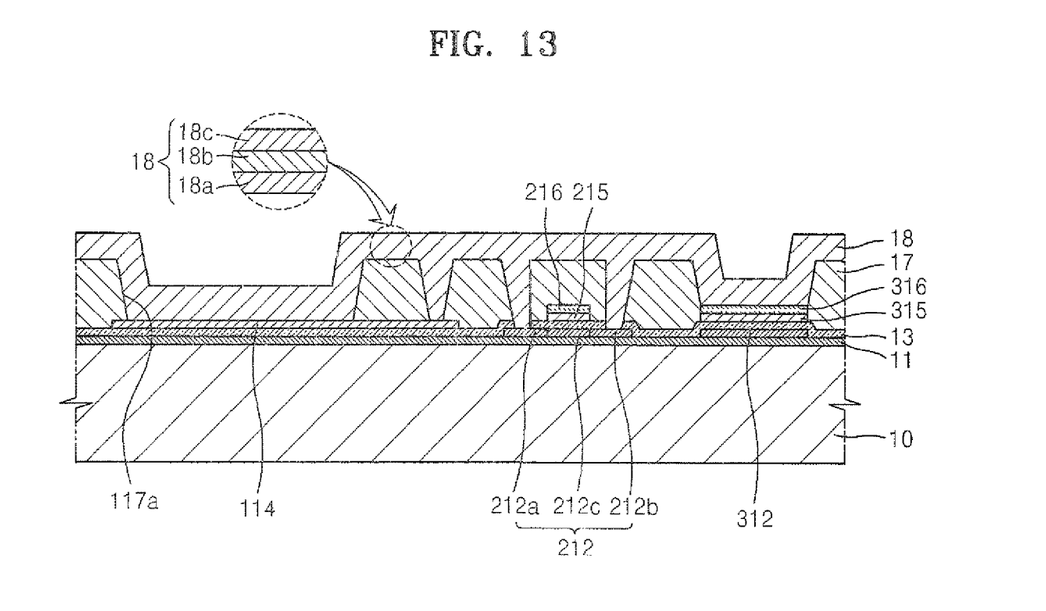

Referring to FIG. 13, a second metal layer 18 is formed on the structure shown in FIG. 12.

The second metal layer 18 may include at least one selected from the group consisting of Al, Pt, Pd, Ag, Mg, Au, Ni, Nd, Ir, Cr, Li, Ca, Mo, Ti, W, and Cu. In the current embodiment, the second metal layer 18 includes Al.

In addition, the second metal layer 18 may include a plurality of metal layers 18a, 18b, and 18c, and in the current embodiment, the second metal layer 18 includes a three-layer structure (Mo/Al/Mo). That is, the metal layer 18b is formed of Al, and the upper and lower metal layers 18a and 18c, respectively, are each formed of Mo, similar to the first metal layer 16. However, the present invention is not limited thereto, and the second metal layer 18 may include various materials and various layers. For example, the second metal layer 18 may be configured as a structure of Ti/Al/Ti.

Figure 14:
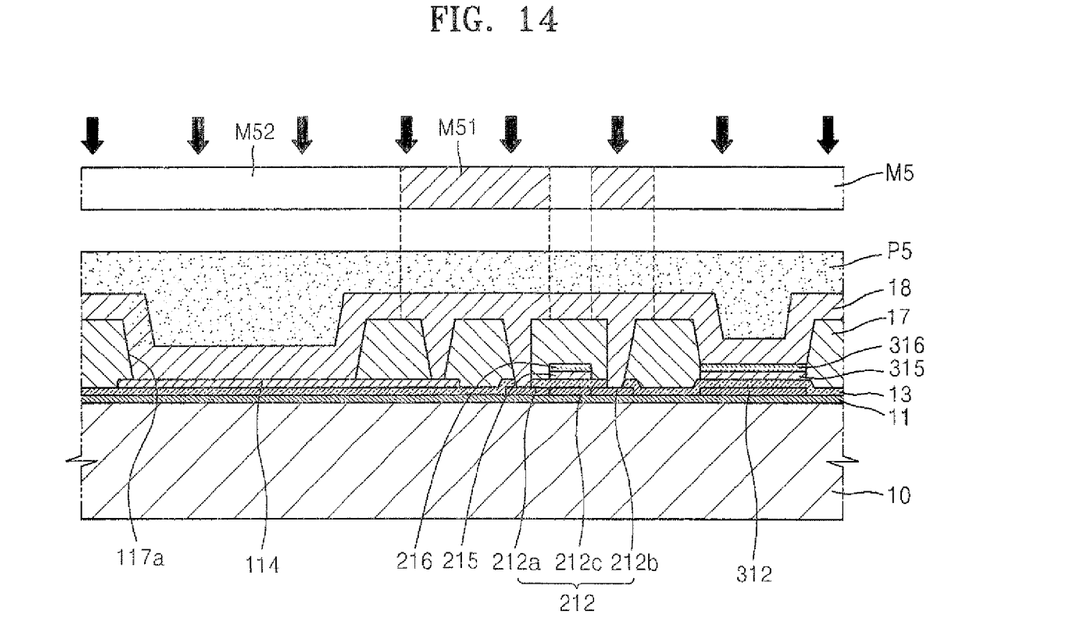

Referring to FIG. 14, a fifth photoresist P5 is applied on the second metal layer 18, and then a fifth mask process is performed using a fifth photomask M5 including light-shielding portions M51 and light-transmitting portions M52.

Figure 15:
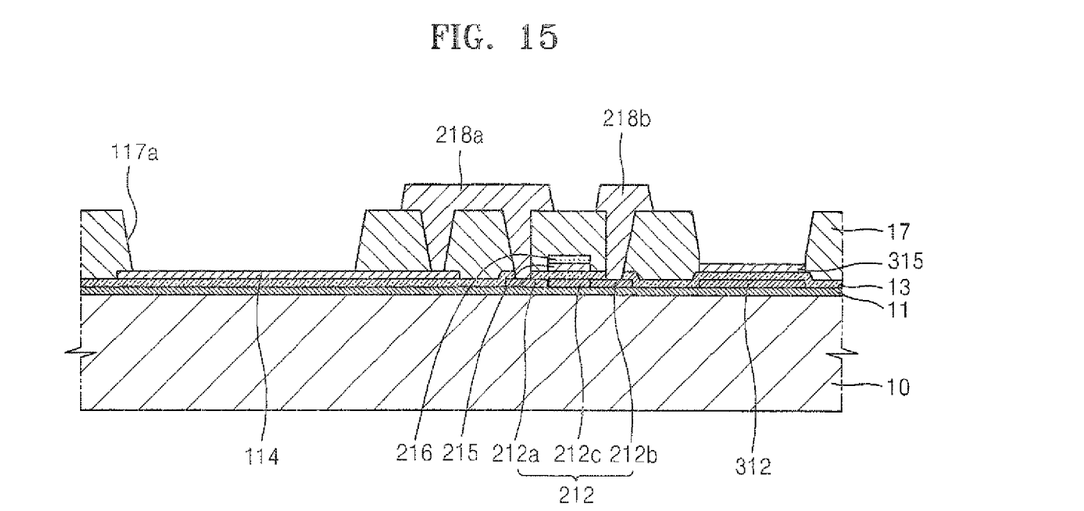

Referring to FIG. 15, source and drain electrodes 218a and 218b, respectively, which contact the source and drain regions 212a and 212b, respectively, of the active layer 212 are formed by patterning the second metal layer 18. When the second metal layer 18 is etched, the second upper electrode 316 of the capacitor, including the first metal layer 16, may also be removed.

The second metal layer 18 may be formed of the same material as the first metal layer 16. In this case, both the first metal layer 16 and the second metal layer 18 may be simultaneously etched through a single etching operation using the same etching solution.

Figure 16:
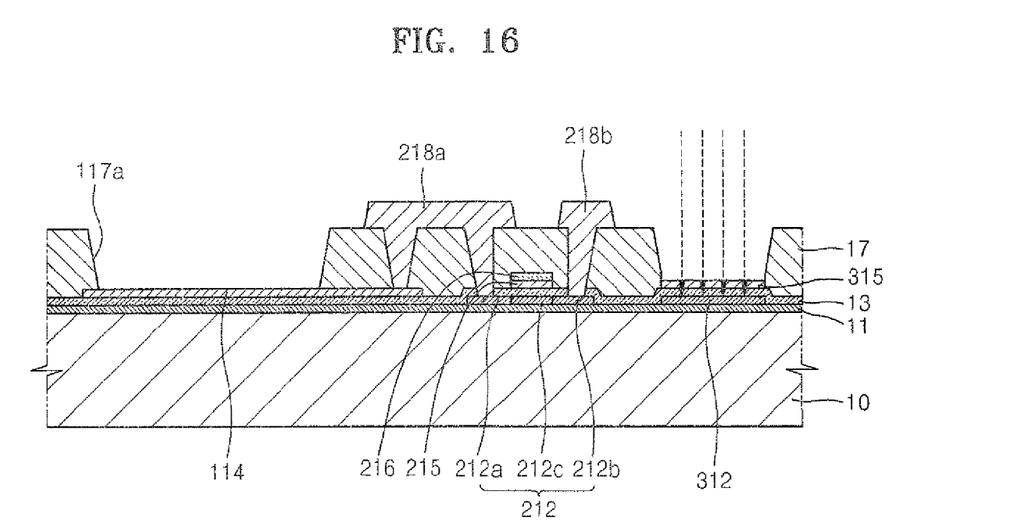

Referring to FIG. 16, the structure formed as a result of the fifth mask process is doped with ion impurities. The ion impurities may be B or P ions. The B or P ions may be doped on the lower electrode 312 of the capacitor formed of the semiconductor layer 12 with a concentration of more than $1 \times 10^{15}$ atoms/cm$^2$. Accordingly, the lower electrode 312 of the capacitor has a high conductivity, and thus the lower electrode 312 and the first upper electrode 315 together form an MIM capacitor, thereby increasing the capacity of the capacitor.

Figure 17:
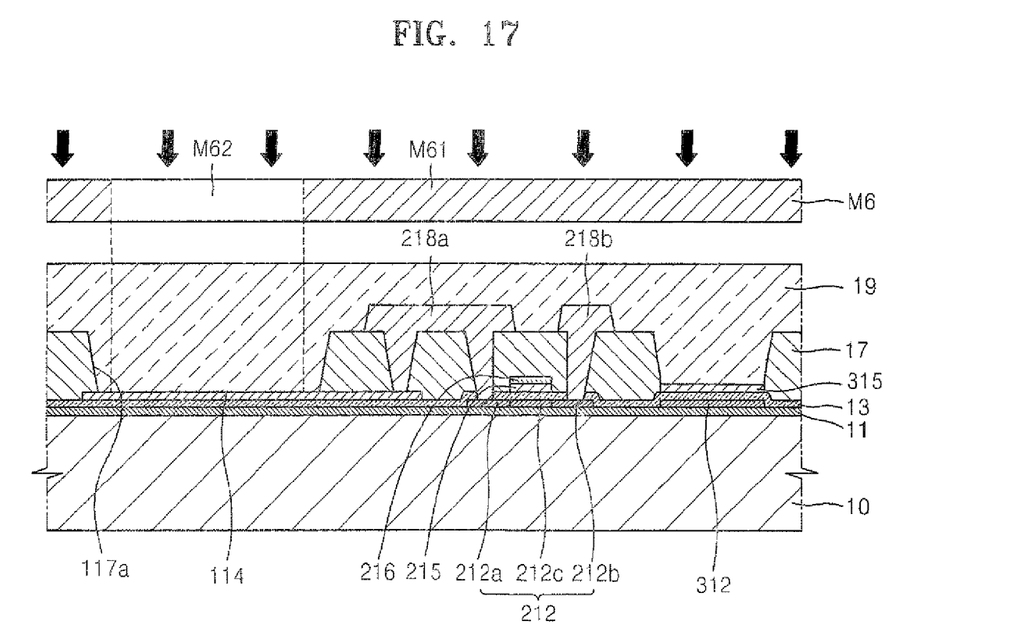

Referring to FIG. 17, a third insulating layer 19 is formed on the structure shown in FIG. 16, and then a sixth mask process is performed using a sixth photomask M6 including light-shielding portions M61 and light-transmitting portions M62. In the present embodiment, the third insulating layer 19 may be formed of a photoresist including a photosensitive material.

Referring to FIG. 18, an opening 119 exposing the pixel electrode 114 is formed in the third insulating layer 19 by patterning the third insulating layer 19.

Referring to FIG. 19, an intermediate layer 21, including an organic emission layer 21a, and an opposite electrode 22 are formed on the pixel electrode 114.

The organic emission layer 21a may be formed of a low-molecular weight organic material or high-molecular weight organic material.

The intermediate layer 21 may include a hole transport layer (HTL), a hole injection layer (HIL), an electron transport layer (ETL), and an electron injection layer (EIL) centering around the organic emission layer 21a, and various other layers may also be stacked when necessary.

The optical resonant structure may be realized with the intermediate layer 21, including the organic emission layer 21a, by adjusting a thickness of the organic emission layer 21a in each pixel, or by adjusting thicknesses of other layers included in the organic emission layer 21a except for the organic emission layer 21a.

The opposite electrode 22 is deposited on the intermediate layer 21 as a common electrode. In the organic light-emitting display device 1 of the current embodiment of FIG. 19, the pixel electrode 114 is used as an anode, and the opposite electrode 22 is used as a cathode. Polarities of the electrodes may be inverted.

In addition, the opposite electrode 22 may be formed as a reflective electrode including a reflective material for realizing the optical resonant structure. At this point, the opposite electrode 22 may include one or more materials selected from the group consisting of Al, Ag, Mg, Li, Ca, LiF/Ca, and LiF/Al.

On the other hand, although not shown in the drawings, a sealing member (not shown) or a moisture absorbent member (not shown) for protecting the organic emission layer 21a from external moisture or oxygen may be further formed on the opposite electrode 22.

In the present invention, the distance between the opposite electrode 22 and the pixel electrode 114 may be a resonant thickness so that light efficiency may further be increased by using optical resonance, even in a bottom emission type display in which an image is displayed toward the substrate 10.

In addition, the lower electrode 312 of the capacitor is formed of an N+ or P+ doped polysilicon, and a first upper electrode 314 is formed of a metal oxide, which is a transparent conductive material, thereby forming a capacitor having an MIM structure. When the capacitor has an MOS structure, a high voltage should be applied to specific wiring of a panel, and thus the risk of an electrical short circuit may be increased. However, in the present invention, such a problem may be prevented from occurring by realizing the capacitor having an MIM structure as described above, thereby increasing the degree of freedom in designing the organic light-emitting display device 1 of FIG. 19.

Hereinafter, an organic light-emitting display device according to a second embodiment of the present invention, and a method of manufacturing the organic light-emitting display device, will be described with reference to FIGS. 20 thru 24.

Figure 20:
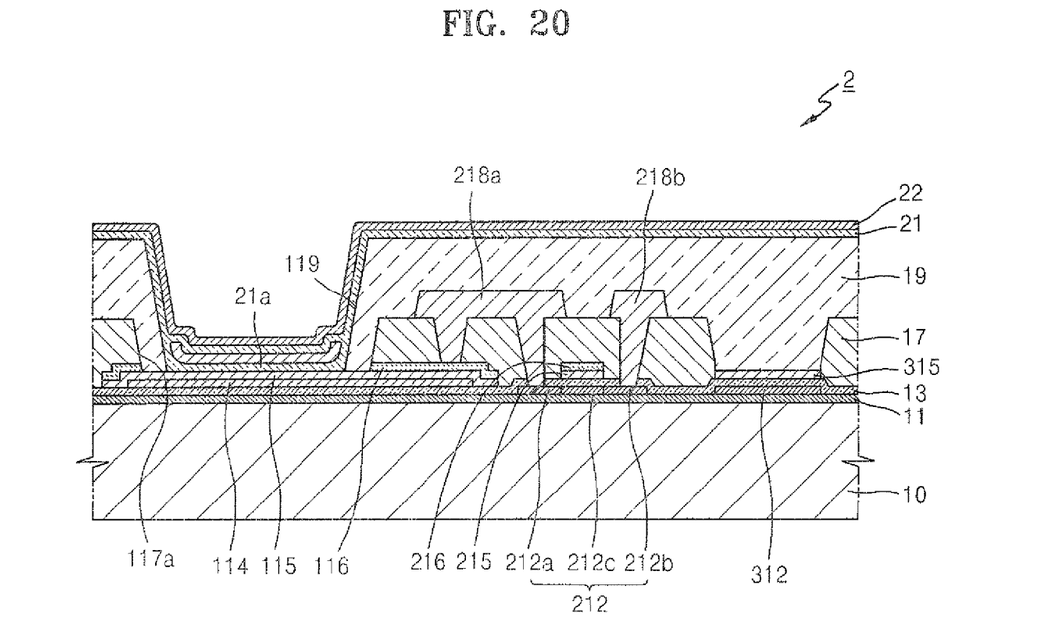
FIG. 20 is a schematic cross-sectional view illustrating an organic light-emitting display device according to a second embodiment of the present invention.

FIG. 20 is a schematic cross-sectional view illustrating the organic light-emitting display device according to a second embodiment of the present invention, and FIGS. 21 thru 24 are schematic cross-sectional views illustrating a method of manufacturing the organic light-emitting display device illustrated in FIG. 20. Hereinafter, differences between the above-described first embodiment and the second embodiment will be mainly described, and the same reference numerals as in the first embodiment represent elements in the second embodiment having the same functions.

Referring to FIG. 20, in the organic light-emitting display device 2, a second pixel electrode 115 entirely surrounds a pixel electrode 114, and third pixel electrodes 116 respectively cover ends of the second pixel electrode 115.

The pixel electrode 114 may be a semi-permeable mirror including an Ag alloy, similar to the above-described first embodiment.

The second pixel electrode 115 may be formed of a transparent conductive material, which is the same as a transparent conductive material including a first gate electrode 215 and a first upper electrode 315 of a capacitor. The second pixel electrode 115 entirely surrounds the pixel electrode 114 and protects the pixel electrode 114, which is a semi-permeable mirror, from an etching solution of a second gate electrode 216 or source and drain electrodes 218a and 218b, respectively, having a different etch rate from the pixel electrode 114 during etching of the second gate electrode 216 or the source and drain electrodes 218a and 218b, respectively.

The third pixel electrode 116 is formed of a metal, which is the same as that for forming the second gate electrode 216.

The third pixel electrodes 116 surround side and top surfaces of the pixel electrode 114 and the second pixel electrode 115, and protect the pixel electrode 114, which is a semi-permeable mirror, during the etching of the second gate electrode 216 or the source and drain electrodes 218a and 218b, respectively.

Figure 21:
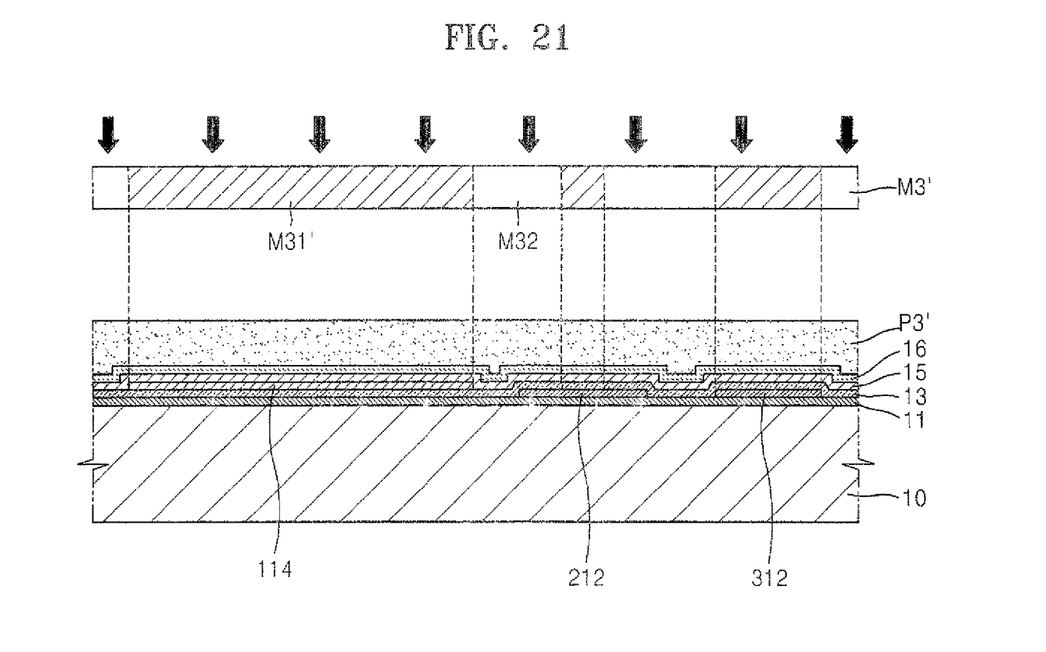
FIGS. 21 thru 24 are schematic cross-sectional views illustrating a method of manufacturing the organic light-emitting display device illustrated in FIG. 20.

Referring to FIG. 21, a transparent conductive layer 15, a first metal layer 16, and a third photoresist P3' are formed on the structure resulting from the second mask process of the above-described first embodiment, and then a third mask process is performed using a third photomask M3', including a light-shielding portion M31' formed in a region corresponding to the pixel electrode 114.

Figure 22:
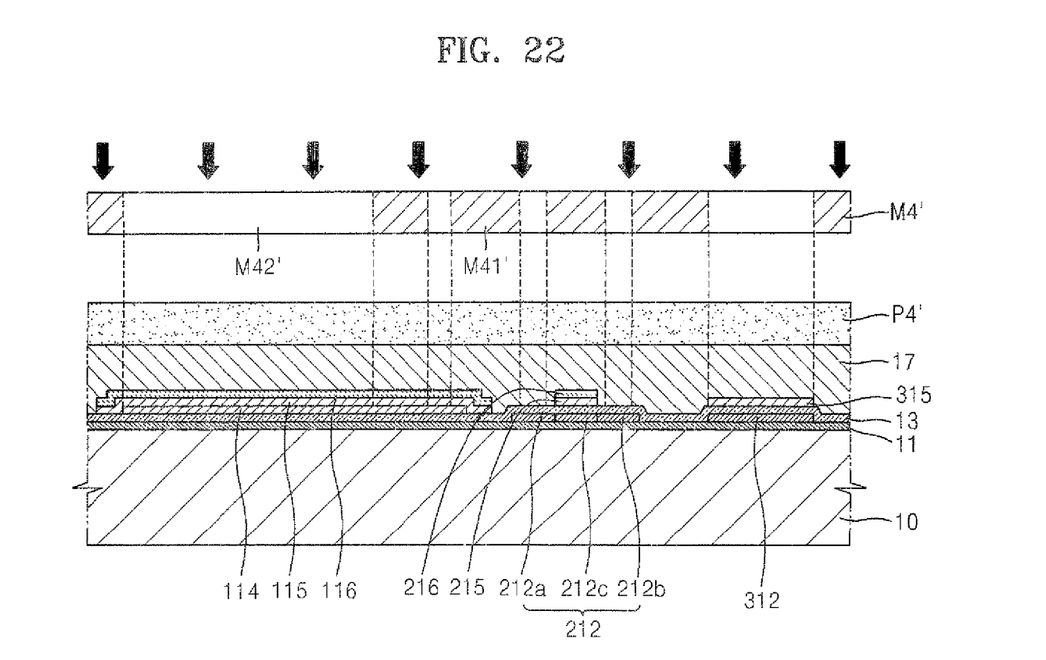

Referring to FIG. 22, as a result of the third mask process, the second pixel electrode 115 formed of a transparent conductive material and the third pixel electrode 116 formed of the first metal layer 16 are patterned so as to surround the entire pixel electrode 114.

A second insulating layer 17 and a fourth photoresist P4' are deposited on the structure formed in FIG. 22, and then a fourth mask process is performed using a fourth photomask M4', including light-shielding portions M41' and light-transmitting portions M42'.

Figure 23:
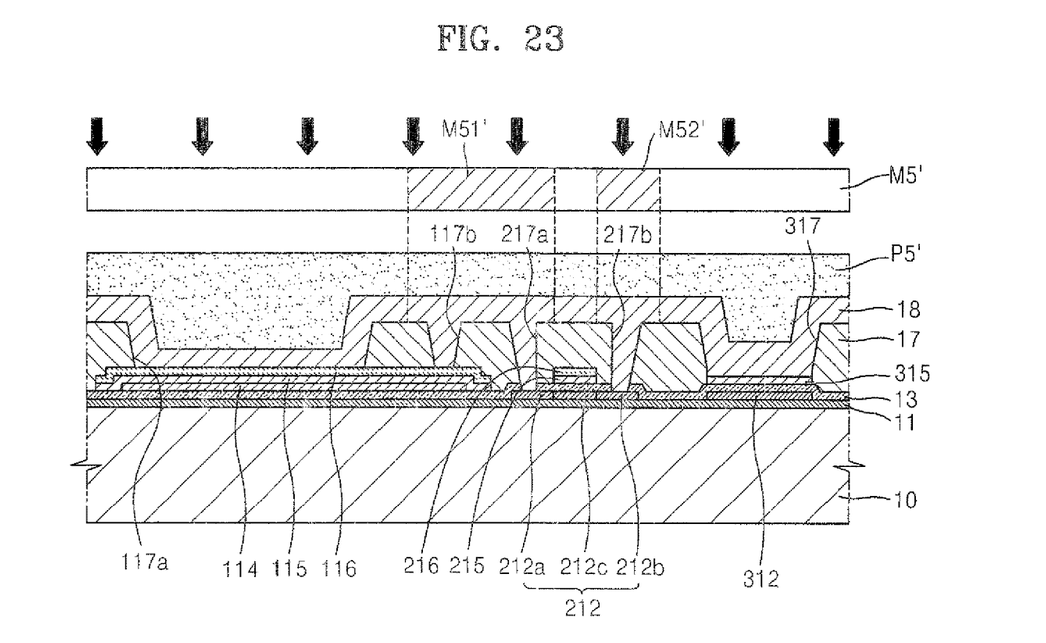

Referring to FIG. 23, as a result of the fourth mask process, first and second openings 117a and 117b, respectively, exposing the third pixel electrode 116, contact holes 217a and 217b, respectively, exposing the source and drain regions 212a and 212b, respectively, of the thin film transistor, and a third opening 317 exposing the second upper electrode 316 of the capacitor are formed in the second insulating layer 17.

A second metal layer 18 and a fifth photoresist P5' are formed on the structure formed in FIG. 23, and then a fifth mask process is performed using a fifth photomask M5', including light-shielding portions M51' and light-transmitting portions M52'.

Figure 24:
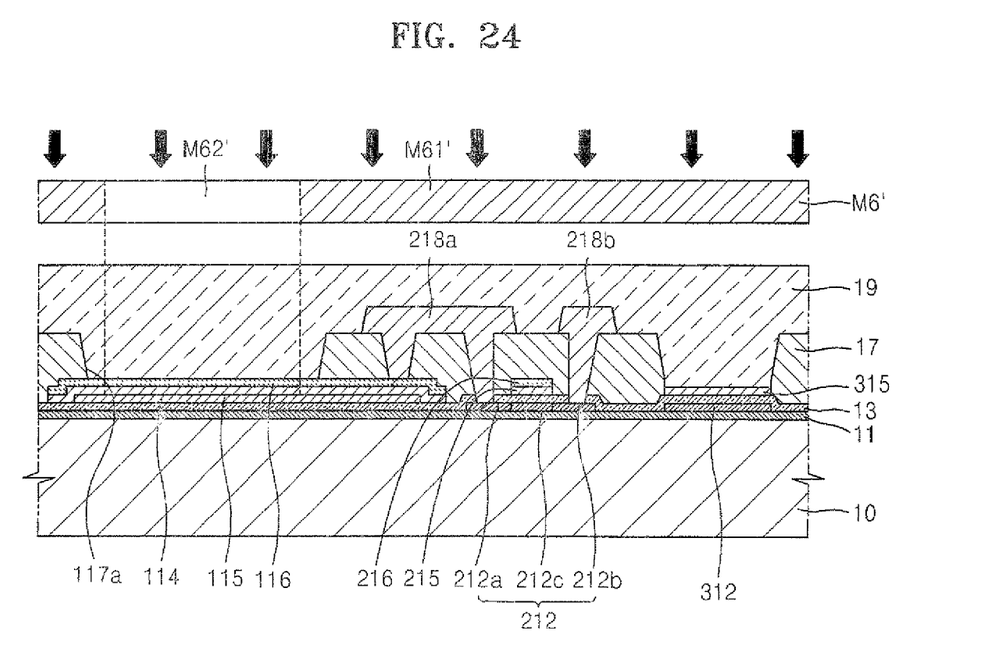

Referring to FIG. 24, as a result of the fifth mask process, the source and drain electrodes 218a and 218b, respectively, are formed by patterning the second metal layer 18. In the present embodiment, the second metal layers 18 disposed on the second pixel electrode 116 and the second upper electrode 316 of the capacitor are removed. In addition, the third pixel electrode 116, including the first metal layer 16, and the second upper electrode 316 of the capacitor together are removed. In the present embodiment, the second pixel electrode 115 formed of a transparent conductive material, and interposed between the pixel electrode 114 and the third pixel electrode 116, protects the pixel electrode 114 formed of a semi-permeable layer under the second pixel electrode 115 from etching.

A third insulating layer 19 is formed on the structure formed in FIG. 24, and then a sixth mask process is performed using a sixth photomask M6', including light-shielding portions M61' and light-transmitting portions M62'.

Accordingly, in the organic light-emitting display device 2 of the second embodiment, the second pixel electrode 115, including a transparent conductive material, surrounds the entire pixel electrode 114, which is a semi-permeable mirror, and thus the second pixel electrode 115 may protect the pixel electrode 114 from an etching solution of the second gate electrode 216 or the source and drain electrodes 218a and 218b, respectively, during etching of the second gate electrode 216 or the source and drain electrodes 218a and 218b, respectively, thereby further increasing the optical efficiency of the organic light-emitting display device 2.

The organic light-emitting display device and a method of manufacturing the same according to the present invention have the following advantages.

A pixel electrode is formed of a semi-permeable mirror, and thus an optical resonance is realized in a bottom emission type display in which an image is displayed toward a pixel electrode, thereby further increasing the optical efficiency of the organic light-emitting display device.

In addition, the semi-permeable mirror is formed of an Ag alloy having an excellent semi-permeable property, and thus the optical efficiency of the organic light-emitting display device may be further increased.

Also, a transparent conductive layer surrounds the semi-permeable mirror, and thus the semi-permeable mirror may be prevented from being damaged during etching of a gate electrode and source and drain electrodes.

In addition, the organic light-emitting display device, including the semi-permeable mirror, may be manufactured by performing a mask processes six times.

Furthermore, a capacitor having an MIM structure can be formed through a simple process, and thus both a process property and a circuit property can be further increased.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
    an active layer of a thin film transistor, the active layer including a semiconductor material and formed on a substrate;
    a lower electrode of a capacitor, the lower electrode including a semiconductor material doped with ion impurities and formed on the substrate;
    a first insulating layer formed on the substrate and covering the active layer and the lower electrode;
    a first gate electrode of the thin film transistor, the first gate electrode comprising a transparent electrically conductive material and formed on the first insulating layer;
    a second gate electrode of the thin film transistor, the second gate electrode comprising a metal and formed on the first gate electrode;
    an upper electrode of the capacitor, the upper electrode comprising a transparent electrically conductive material and formed on the first insulating layer;
    source and drain electrodes of the thin film transistor, the source and drain electrodes electrically connected to the active layer;
    a pixel electrode formed of a semi-permeable metal on the first insulating layer and electrically connected to one of the source and drain electrodes;
    an intermediate layer including an organic emission layer and formed on the pixel electrode; and
    an opposite electrode facing the pixel electrode, the organic emission layer disposed between the opposite electrode and the semi-permeable metal.

2. The organic light-emitting display device of claim 1, wherein the semi-permeable metal is a silver (Ag) alloy.

3. The organic light-emitting display device of claim 2, wherein the Ag alloy comprises palladium (Pd) and copper (Cu).

4. The organic light-emitting display device of claim 2, wherein the semi-permeable metal has a thickness in a range of about 80 to 200 Å.

5. The organic light-emitting display device of claim 1, wherein the first gate electrode and the upper electrode of the capacitor include the same transparent electrically conductive material, and the transparent electrically conductive material includes at least one material selected from the group consisting of indium tin oxide (ITO), indium zinc oxide (IZO), zinc oxide (ZnO), indium oxide (In2O3), indium gallium oxide (IGO), and aluminum zinc oxide (AZO).

6. The organic light-emitting display device of claim 1, wherein the second gate electrode has an etch rate different from an each rate of the pixel electrode.

7. The organic light-emitting display device of claim 6, wherein the second gate electrode includes at least one material selected from the group consisting of aluminum (Al), platinum (Pt), Pd, Ag, magnesium (Mg), gold (Au), nickel (Ni), neodymium (Nd), iridium (Ir), chrome (Cr), lithium (Li), calcium (Ca), molybdenum (Mo), titanium (Ti), tungsten (W), and Cu.

8. The organic light-emitting display device of claim 6, wherein the second gate electrode comprises a plurality of layers, at least one of the plurality of layers having a different metal from the other.

9. An organic light-emitting display device, comprising:
    an active layer of a thin film transistor, the active layer including a semiconductor material and formed on a substrate;
    a lower electrode of a capacitor, the lower electrode including a semiconductor material doped with ion impurities and formed on the substrate;
    a first insulating layer formed on the substrate and covering the active layer and the lower electrode;
    a first gate electrode of the thin film transistor, the first gate electrode comprising a transparent electrically conductive material and formed on the first insulating layer;
    a second gate electrode of the thin film transistor, the second gate electrode comprising a metal and formed on the first gate electrode;
    an upper electrode of the capacitor, the upper electrode comprising a transparent electrically conductive material and formed on the first insulating layer;
    source and drain electrodes of the thin film transistor, the source and drain electrodes electrically connected to the active layer;
    a pixel electrode including a semi-permeable metal electrically connected to one of the source and drain electrodes and formed on the first insulating layer;
    an intermediate layer including an organic emission layer and formed on the pixel electrode;
    an opposite electrode facing the pixel electrode with the intermediate layer disposed between the opposite electrode and the pixel electrode; and
    a second pixel electrode including a transparent electrically conductive material which surrounds the entire pixel electrode, the transparent electrically conductive material being the same as a metal of the first gate electrode.

10. The organic light-emitting display device of claim 9, further comprising a third pixel electrode including a metal which covers ends of the second pixel electrode, wherein the metal is the same as the metal of the second gate electrode.

11. The organic light-emitting display device of claim 10, wherein outer etched surfaces of the second pixel electrode and the third pixel electrode have the same shape.

12. The organic light-emitting display device of claim 10, wherein the third pixel electrode, the second gate electrode, and the source and drain electrodes are formed of a same metal.

13. The organic light-emitting display device of claim 1, wherein the pixel electrode is a semi-permeable mirror partially receiving and reflecting light emitted from the organic emission layer.

14. The organic light-emitting display device of claim 1, wherein the opposite electrode is a reflective electrode reflecting light emitted from the organic emission layer.

15. The organic light-emitting display device of claim 1, wherein outer etched surfaces of the first gate electrode and the second gate electrode have the same shape.

\* \* \* \* \*